United States Patent
Hamdan

(10) Patent No.: US 6,788,077 B2
(45) Date of Patent: Sep. 7, 2004

(54) AUTOMATED TEST SEQUENCE EDITOR AND ENGINE FOR TRANSFORMER TESTING

(75) Inventor: Fadi Adel Hamdan, Raleigh, NC (US)

(73) Assignee: ABB Inc., Raleigh, NC (US)

( * ) Notice: Subject to any disclaimer, the term of this patent is extended or adjusted under 35 U.S.C. 154(b) by 0 days.

(21) Appl. No.: 10/028,831

(22) Filed: Dec. 20, 2001

(65) Prior Publication Data

US 2004/0124860 A1 Jul. 1, 2004

(51) Int. Cl.[7] .......................... G01R 31/06; G01R 29/20
(52) U.S. Cl. ..................................... 324/726; 324/547
(58) Field of Search .......................... 324/547, 55, 726; 340/646; 702/113, 118, 119, 120

(56) References Cited

U.S. PATENT DOCUMENTS

| | | | |
|---|---|---|---|
| 4,654,806 A | * 3/1987 | Poyser et al. ............... | 700/292 |
| 4,857,856 A | 8/1989 | Coleman et al. ............ | 324/547 |
| 5,264,799 A | 11/1993 | Huang et al. ............... | 324/726 |
| 5,276,402 A | 1/1994 | Schucht ...................... | 324/726 |
| 5,764,545 A | 6/1998 | Cannata et al. ............. | 364/580 |
| 5,777,841 A | 7/1998 | Stone et al. ................ | 364/554 |
| 6,154,037 A | 11/2000 | Ashley et al. .............. | 324/623 |
| 6,260,065 B1 | 7/2001 | Leiba et al. ................ | 709/224 |

* cited by examiner

*Primary Examiner*—N. Le
*Assistant Examiner*—Donald M Lair
(74) *Attorney, Agent, or Firm*—Woodcock Washburn LLP

(57) ABSTRACT

A system and method for creating, editing, and/or executing a test program for testing a transformer is provided. The system includes an input that allows the user to select the desired test instructions and pre-existing sequences of test instructions to create or edit a test program having a sequence of test instructions. The processor executes the test program by generating commands that are performed in a predetermined order.

24 Claims, 9 Drawing Sheets

AUTOMATED TEST SEQUENCE EDITOR AND ENGINE FOR TRANSFORMER TESTING

FIELD OF THE INVENTION

The present invention relates in general to transformer testing and, more particularly, to automated test equipment for transformer testing.

BACKGROUND OF THE INVENTION

Transformers are tested by their manufacturers and by electric utilities. The tests may include polarity, phase relation, core loss, load loss, and transformer ratio. However, there is no universal testing procedure followed by all testers. Different standards are followed and sometimes transformer manufacturers implement their own custom test sequences. Many times, the customer requires the manufacturer to follow a certain test sequence, and with many different customers, changing test sequences after every order is not an easy task for the manufacturer's transformer testing facility. Moreover, different systems are typically needed to implement different tests.

Automated testers test transformers according to a test program having a predetermined sequence of test instructions. In other words, the test program executes a fixed sequence of test instructions that cannot be edited or is extremely difficult to edit. For example, if the test program selects a transformer test which is programmed to first run a winding resistance test and then a voltage ratio test at a certain set of parameters, then each time the transformer test is selected, the winding resistance test is performed first and the voltage ratio test is performed second. Thus, the sequence of test instructions is arranged such that a sequence of test instructions specifying a winding resistance test is listed before a sequence of test instructions specifying a voltage ratio test. The disadvantage of having a test program with a fixed sequence of test instructions is that the user does not have the flexibility of editing or creating a particular sequence to optimize the transformer test program.

Therefore, an automated transformer tester having a sequence editor to edit or to create customized test programs, along with a test engine that can implement a variety of tests and test sequences, is desirable. It is further desirable to have one testing system that can perform multiple tests without the need for different controllers or systems.

SUMMARY OF THE INVENTION

The present invention is directed to a transformer test sequence editor for transformer testing that enables a tester to implement any test sequence, whether standard or customized, with any test parameters. A transformer test sequence engine is also provided that enables a tester to perform tests created using a test sequence editor and to monitor the test results. The automated test sequence editor and engine allows the transformer tester to edit a test sequence in any order. The tester can also modify any or all of the test parameters.

According to an embodiment of the invention, a system for testing a transformer comprises a processor comprising a transformer test engine adapted to execute a transformer test sequence; a controller coupled to the processor to output control commands; a switcher coupled between the controller and the transformer to switch power to the controller responsive to the control commands; and a metering system coupled between the transformer and the processor to receive measurements from the transformer and provide the measurements to the processor.

According to aspects of the invention, a memory device is coupled to the processor for storing transformer specifications. A memory device may also be provided for storing the transformer test sequence.

According to further aspects of the invention, a test sequence editor allows customization of the transformer test sequence.

Another embodiment of the present invention is directed to a method for testing a transformer comprising connecting the transformer to a processor comprising a transformer test engine; loading a customized transformer test sequence into the processor; and executing the customized transformer test sequence with the transformer test engine.

According to aspects of the invention, results of the execution are provided to the processor along with transformer specifications to the processor. It is determined whether the transformer passes responsive to the results and the transformer specifications.

A further embodiment of the present invention is directed to a method for creating or editing a customized transformer test program comprising selecting at least one test instruction or pre-existing sequence of test instructions from a plurality of transformer test instructions; providing at least one associated parameter for each of the selected test instructions or pre-existing sequence of test instructions; and defining an order of execution of each of the test instructions.

According to aspects, of the invention, the order of execution of each of the test instructions is stored, and the test instructions are executed in accordance with the order. A transformer test sequence is generated based on the order.

The foregoing and other aspects of the present invention will become apparent from the following detailed description of the invention when considered in conjunction with the accompanying drawings.

DESCRIPTION OF EXEMPLARY EMBODIMENTS AND BEST MODE

The present invention relates to a transformer test sequence editor for transformer testing that enables a tester to implement any test sequence, whether standard or customized, with any test parameters. A transformer test sequence engine is also provided that enables a tester to perform tests created using a test sequence editor and to monitor the test results. The automated test sequence editor and engine allows the transformer tester to edit a test sequence in any order. The tester can also modify any or all of the test parameters. After creating the test sequence using a graphical user interface, for example, the tester can save the sequence.

Figure 1:
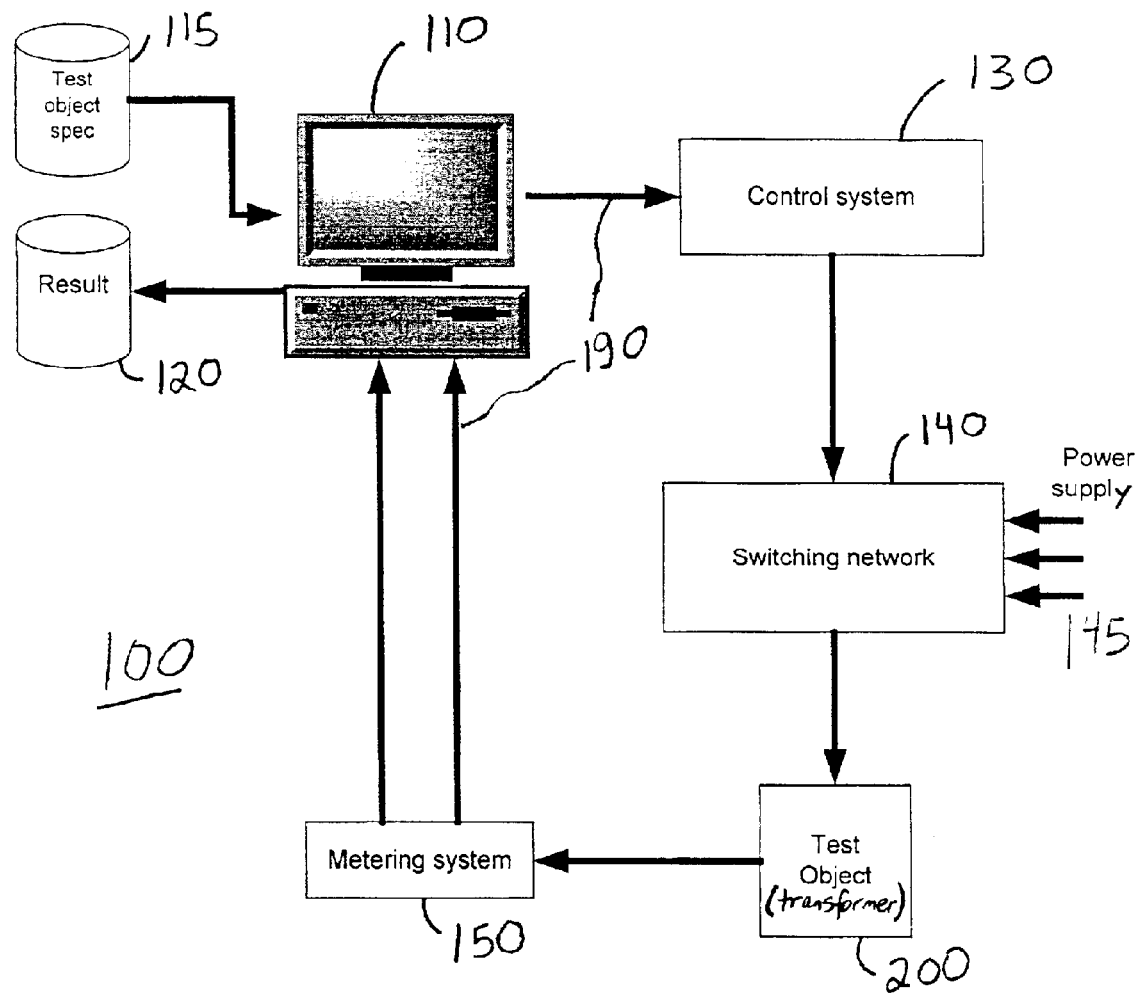
FIG. 1 is a block diagram of an exemplary system in accordance with the present invention used for testing transformers.

FIG. 1 is a block diagram of an exemplary system in accordance with the present invention used for testing transformers. It is appreciated that the present invention may also be used to test other types of electronic equipment. The transformer testing system 100 includes a processor 110, memory devices 115, 120, a controller 130, a switcher 140, and a metering system 150. A transformer 200 that is to be tested is disposed between the switcher 140 and the metering system 150. The switcher 140 is coupled to a power supply 145 and provides power to the transformer 200 during the test. The memory devices 115, 120, the controller 130, and the metering system 150 are coupled to the processor 110 via a bus 190. In one embodiment, the processor 110 is an IBM compatible personal computer having a Pentium processor manufactured by Intel Corporation and the bus 150 is a general purpose interface bus.

Figure 2:
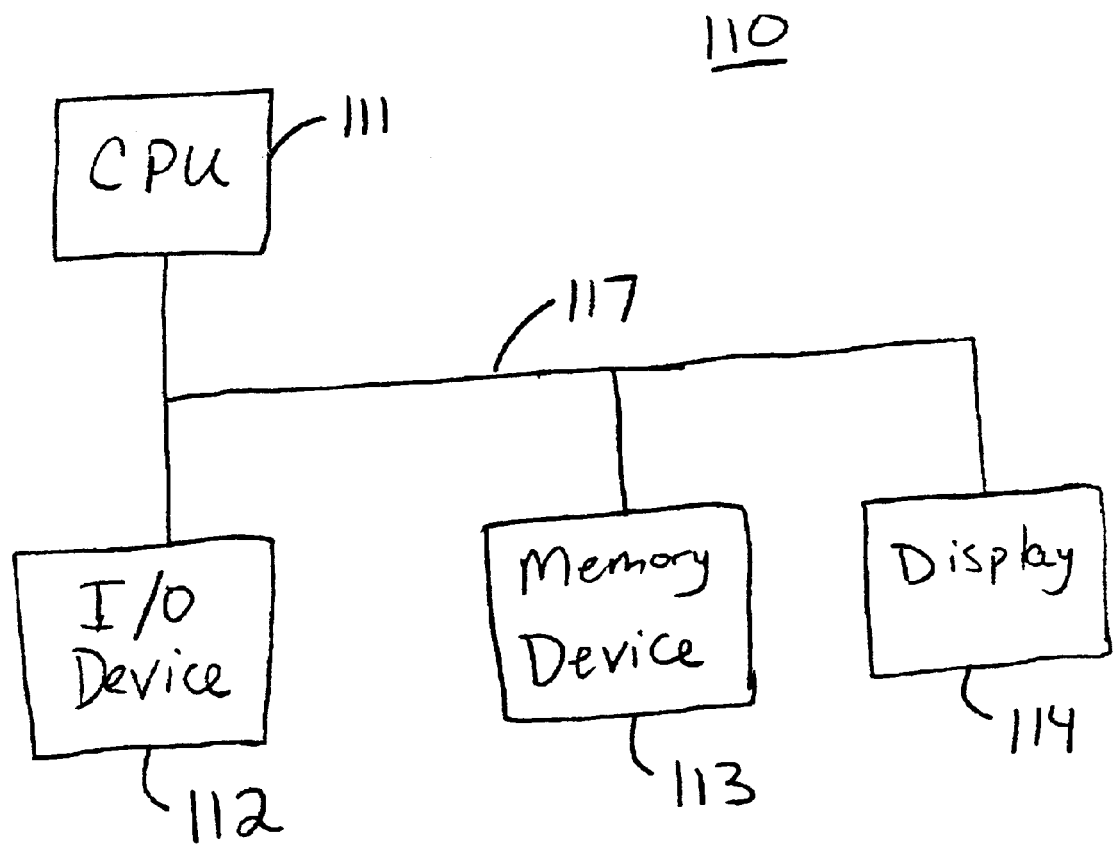
FIG. 2 is a block diagram of an exemplary processor in accordance with the present invention.

As shown in FIG. 2, the processor 110 preferably includes a CPU 111 coupled to an input/output device 112, a memory device 113, and a display 114 via a data bus 117. The input/output device 112 includes alphanumeric oriented input/output devices such as a keyboard or a mouse and real-time data-oriented input/output devices such as analog-to-digital converters and digital-to-analog converters. The memory device 113 includes random access memory (RAM), read-only memory (ROM) and mass memory devices such as a disk drive. The display device 114 can be a computer terminal or monitor, for example. The data bus 117 is used for communication between the CPU and the memory or the peripheral devices.

In accordance with the present invention, the processor 110 includes a test sequence editor that allows the user to customize a transformer test program having a sequence of test instructions by entry of input commands.

The memory devices 115, 120 can be RAM, ROM, or mass memory devices such as a disk drive, and can be separate or reside within the same memory device. Preferably, the memory device 115 comprises transformer specifications, and the memory device 120 receives and stores the results of the transformer test, which can be used for future study and analysis.

The switcher 140 is controlled by the controller 130 to provide power from the power supply 145 to the transformer 200 being tested. The metering system 150 receives the measurements from the transformer 200 and provides the measurements to the processor 110. The processor 110 processes the measurements and stores the result(s) in the memory device 120 or elsewhere.

A transformer test program can be customized by creating or editing a new sequence of test instructions from individual test instructions or other pre-existing sequences of test instructions via the test sequence editor residing in the processor 110. A sequence of test instructions comprises test instructions that are executed in a predetermined order. A user can create sequences for testing a transformer and store these sequences for future use, either as a stand-alone test sequence or as a portion of a larger test sequence. Therefore, individual test instructions as well as pre-existing sequences of test instructions can be used as building blocks to create or edit a transformer test program. In other words, a new sequence of test instructions may operate as its own test program or may be used as a building block for another test program. Thus, the sequence editor provides the flexibility of creating new sequences of test instructions from a combination of existing test instructions and preexisting sequences of test instructions. Note that a test instruction includes an instruction that is executed by the processor to either control some aspect of the hardware of the testing system or to process data.

After the user creates or edits the test program by selecting the desired test instruction or preexisting sequence of test instructions along with associated parameters via the input/output device 112, the test program is saved as a file in the memory device 113 or elsewhere.

Test instructions that can be used in building test sequences include, but are not limited to, winding resistance test, voltage ratio test, magnetizing current test, load test, and induced overvoltage test. Additional tests are described below. Parameters that can be set to act on these tests include, but are not limited to, test voltage, test duration, ramp profile, and temperature range, as further described below.

Figure 3:
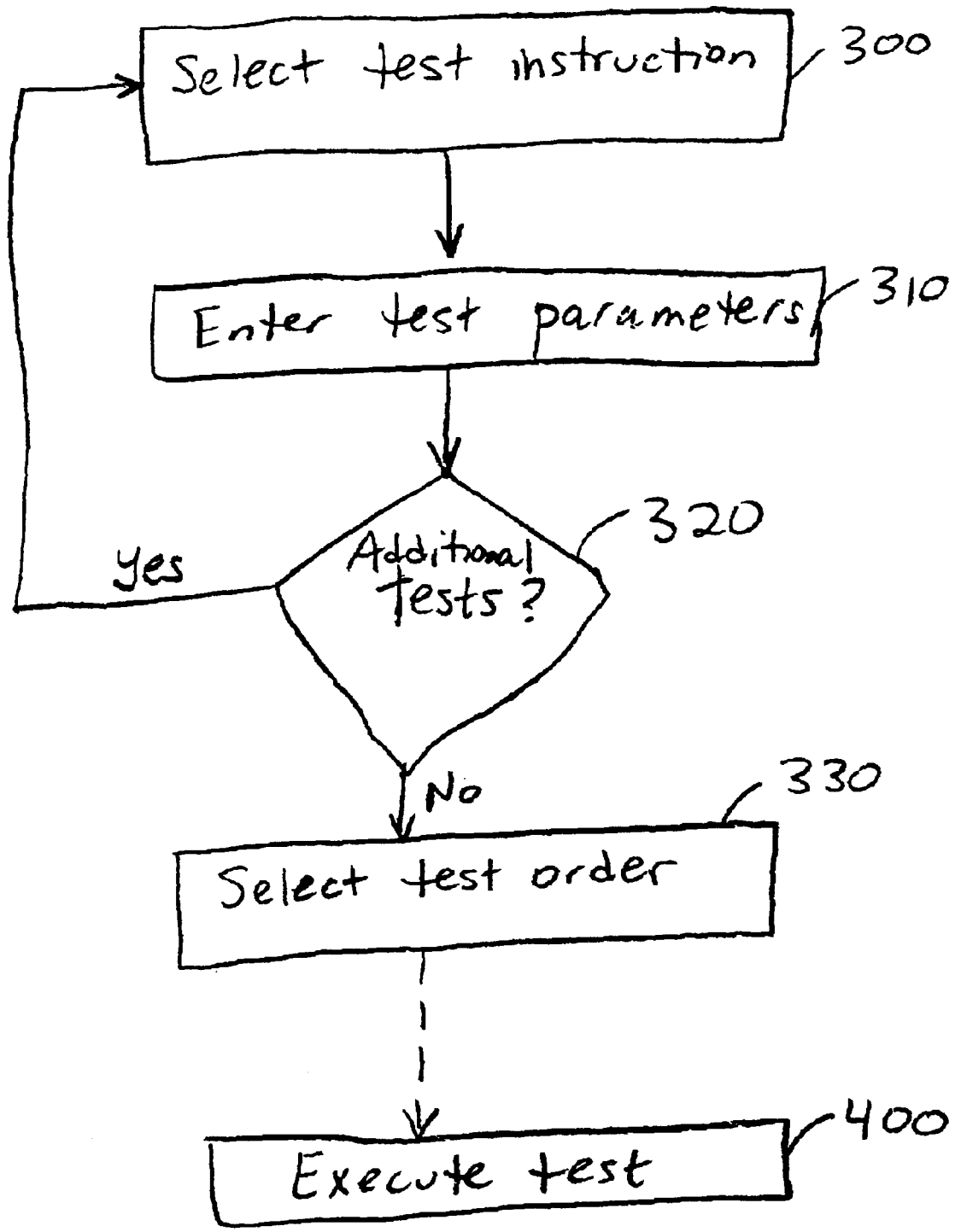
FIG. 3 is a flow chart of an exemplary method of creating or editing a customized transformer test program in accordance with the present invention.

FIG. 3 is a flow chart of an exemplary method of creating or editing a customized transformer test program in accordance with the present invention. Commands are inputted into a processor at step 300 in order to create or edit a test program. More particularly, the user selects a test instruction or a pre-existing sequence of test instructions by inputting entry commands into the processor 110 via its user interface. At this point, the user inputs or selects the tests to be performed by entering commands or objects via a graphical user interface, for example. The user can prepare new tests or use previously selected, entered, and/or stored tests.

Next, at step 310, the user enters test parameters (such as test voltage, test duration, ramp profile, and temperature range) to be used during execution of the test. Programmable test equipment is used under computer control to set the desired parameters and conditions for any particular test condition and to record the desired measurements. At this point, the tests are to be performed in the order in which they were entered into the test program. This order can be changed, for example, at step 330, described below.

At step 320, it is determined whether the user desires to select additional tests to be included in the test sequence. If so, processing returns to step 300 until the user has entered all the desired tests and parameters. The user continues selecting and defining the order of execution of other test instructions and/or pre-existing sequences that he wishes to incorporate into the transformer test program.

After the user has completed entry of the desired tests and parameters, at optional step 330, the user can re-define the order of execution of the selected tests within the test program (i.e., re-order the sequence in which the selected tests are to be performed). In other words, the user specifies when the selected test or pre-existing sequence of test instructions should be executed in relation to the other tests or pre-existing sequences of test instructions in the test program. In this manner, the sequence editor allows the user to specify those test instructions or pre-existing sequences of test instructions most likely to cause a failure to be performed before other test instructions or pre-existing sequences of test instructions which are not as likely to cause a failure.

At this point, the user has created a customized transformer test program that is executable. The test program can then be executed via the test engine, at step 400, to determine whether the transformer passes or fails the customized test program.

The test instructions can be implemented in any computer language. In one embodiment of the present invention, the test instructions are implemented using LabVIEW software by National Instruments.

Figure 4:
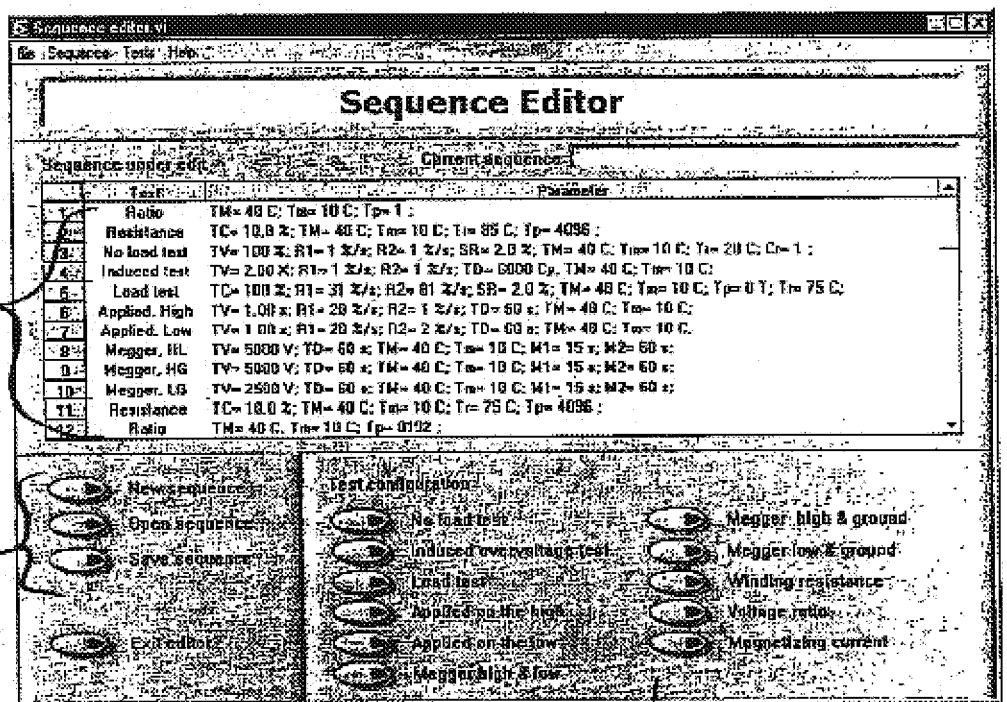
FIG. 4 is an exemplary transformer test sequence editor screen shot, with an exemplary transformer test program, in accordance with the present invention.

FIG. 4 is an exemplary transformer test sequence editor screen shot, with an exemplary transformer test program, in accordance with the present invention. The test sequence 405 includes various tests with parameters, in a particular order of execution. Parameters shown include TV (test voltage), Tr (reference temperature), TM (temperature maximum), Tm (temperature minimum), M1, M2, M3 (measurements 1, 2, and 3), Tp (tap), TC (test current), TD (test duration), AT (automatic), R1, R2 (ramp up), and Cr (correction).

Commands 410 include "new sequence" which allows a user to enter a new sequence for testing, "open sequence" which allows the user to open previously saved sequences and lists, and "save sequence" which allows the user to save the format of the tests. After the "save sequence" command is selected, the user can activate the same test on other transformers or within other test sequences, by selecting it via the "open sequence" command.

Test configurations 420 are provided to give selection access to a user. By selecting a test name, the test will be included in the sequence for editing and execution.

According to FIG. 4, the first test to be performed is the ratio test with a maximum temperature parameter of 40° C., a minimum temperature parameter of 10° C., with tap 1. Additional tests (and parameters) to be performed following the ratio test in the order provided are also shown. After executing the various tests, the system can determine whether the transformer passes or fails, or classify the transformer into a particular grade or level of performance.

Figure 5:
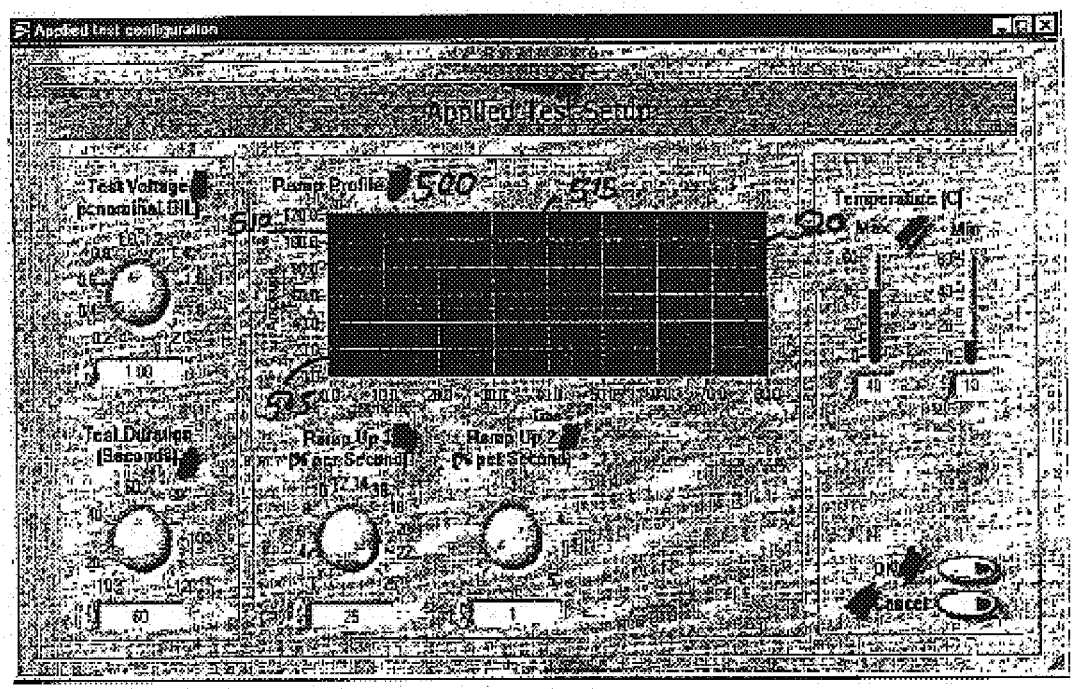
FIG. 5 is an exemplary applied test setup screen shot in accordance with the present invention.

An exemplary applied test setup screen shot is shown in FIG. 5. The applied test tests the insulation of the magnetic field. A high AC voltage is applied between the bushings and the ground. Either a high voltage or a low voltage can be applied. The choice of which one is to be used is available in the sequence editor screen, where the user can select high applied or low applied.

With respect to FIG. 5, nominal BIL is the basic insulation level of the bushings. The test voltage results by multiplying the basic insulation level of the bushings by a user provided factor number, which can be entered via an input device such as the keyboard or a selection on the test setup screen.

With respect to the test duration, the user may enter the amount of time the test is to last. The test duration is represented on a ramp profile 500 by the horizontal line 515 at 100% amplitude.

The ramp profile 500 is presented in the form of a curve. The first substantially linear line 505, which runs from 0% to about 90% amplitude is the Ramp Up1 speed. The slope of the curve is steep, representing a rise in a relatively small time interval, and hence a rise at high velocity. When the curve reaches about 90% amplitude, the speed decreases. This second curve 510 has a less steep slope, representing a rise during a relatively large time interval. Once the curve reaches about 100% amplitude, the ramp up speed becomes zero, at which time the test is performed. The horizontal line 515 represents the test duration. Once the test is over, the ramp down begins at maximal speed, represented on the curve by the negative slope 520. The curve eventually reaches 0% amplitude, and the particular test is over.

Ramp Up1 is the speed %/sec of the rise in amplitude towards the performance of the test. The range is preferably between 0%/sec and about 25%/sec, and is user selectable. This speed lasts until the curve reaches about 90% of the required amplitude.

Ramp Up2 is the speed of approaching the test, between about 90% amplitude up to about 100% amplitude at which the test begins. The range for the Ramp Up2 is preferably smaller than that of the Ramp Up1, so as to ensure a slower approach towards the test.

Temperature Max is the maximum temperature under which the test will run, and Temperature Min is the minimum temperature desired for the test to run. The user can set the desired temperature range via the graphical user interface, or by typing in the values.

Figure 6:
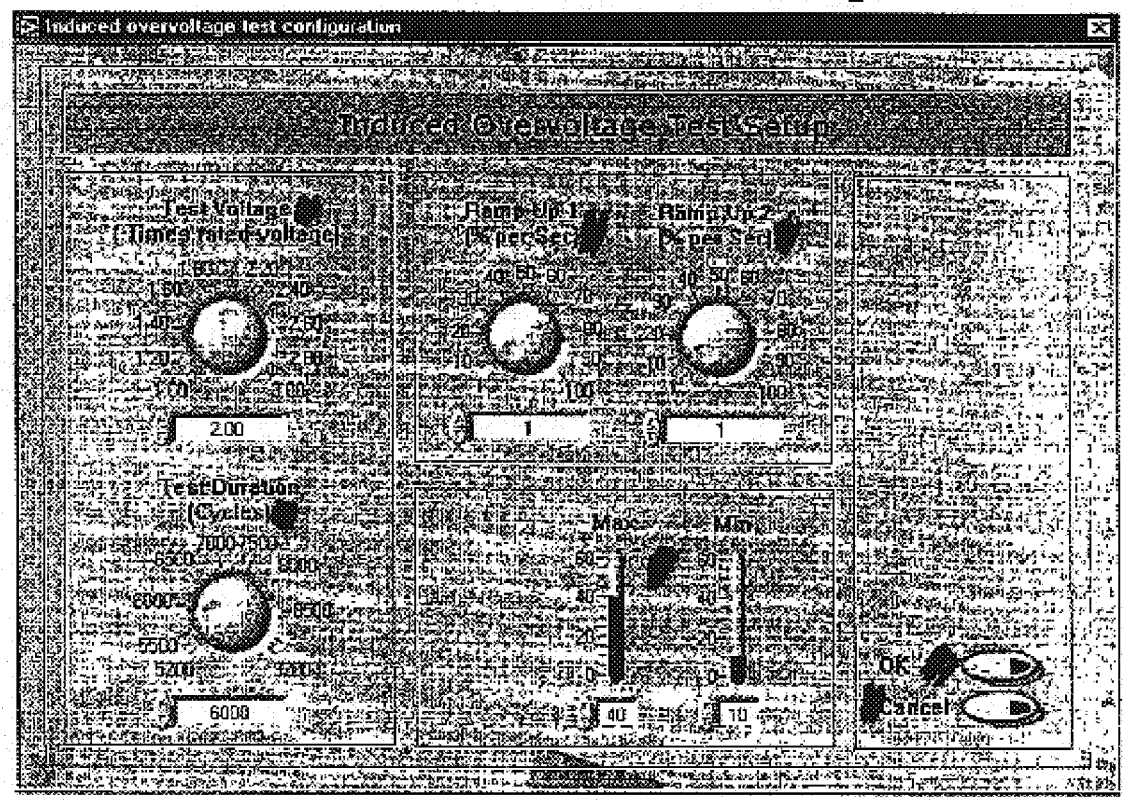
FIG. 6 is an exemplary induced overvoltage test setup screen shot in accordance with the present invention.

An exemplary induced test setup screen shot is shown in FIG. 6. The induced test tests the insulation of the transformer. Here the user preferably applies double the voltage, and simultaneously doubles the frequency. If the frequency is not doubled, then the magnetic field will be too large and the transformer will be ruined, so in order to keep a low magnetic field, the frequency is preferably at least doubled when doubling the voltage.

The test voltage is a user chosen constant multiplied by the rated voltage. This number multiplies the rated voltage of the transformer to get the desired test voltage.

Test duration is measured in cycles, with the range of the cycles preferably between about 5200 and 9200. The user has the choice, and the entry can be made via the knob, the scroll bar, or by typing it in the box below the knob, for example.

Ramp Up1, is similar to the Ramp Up1 in the applied test. The voltage increases at a rate specified by the user. This Ramp Up1 is the speed at which the voltage increases to about 90% of the required voltage. Ramp Up2 is the speed at which the voltage rises between about 90% until it reaches the desired test voltage. The speed of Ramp Up2 is preferably slower than that of Ramp Up1, so as to ensure a slow and accurate approach to the high voltage. This is also set by the user.

The maximum and minimum temperatures for the operation of the test are preferably set by the user. If the temperature is below the minimum, or higher than the maximum, the test will not be performed.

Figure 7:
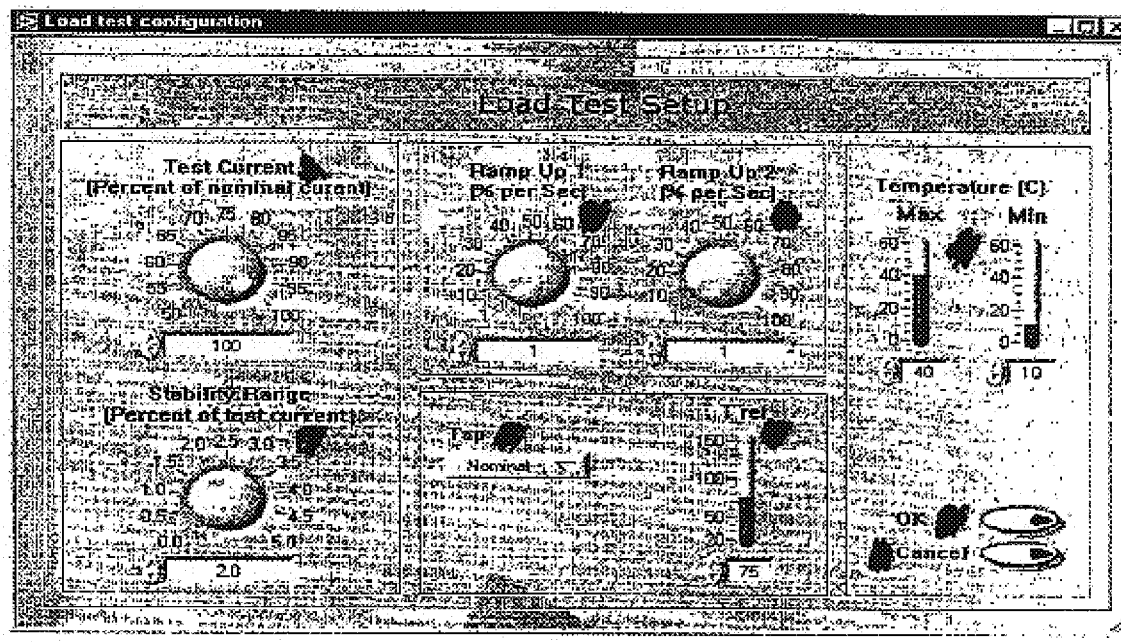
FIG. 7 is an exemplary load test setup screen shot in accordance with the present invention.

An exemplary load test setup screen shot is shown in FIG. 7. The load test setup measures the load losses generated by current. The low voltage side is short-circuited and the voltage is raised on the high side to reach the rated current. The power is then measured, which configures the load loss amount.

The user has the choice of performing the test under a current that is not the rated current, but rather a percentage of the nominal current. The user can choose the desired percentage of the nominal current.

The stability range is a percent of the test current. The current is preferably stable for the test to be performed. The user has the ability to choose the desired percentage of the test current, in order for the test to remain stable.

The nominal tap is the tap at which the voltage is the test voltage itself. The user can choose a tap, where each tap is a certain percentage of the test voltage, hence the user can choose a tap according to the desired voltage. For example, if a tap is set to 2.5%, then the voltage would become 2.5% of the test voltage. Selecting the highest tap is useful if the whole winding is to be tested.

T ref is the user selectable reference temperature to which the temperature in the load loss can be compared. The maximum and minimum temperatures are the endpoints of the range in between which the test can run. These temperatures are user selectable.

Figure 8:
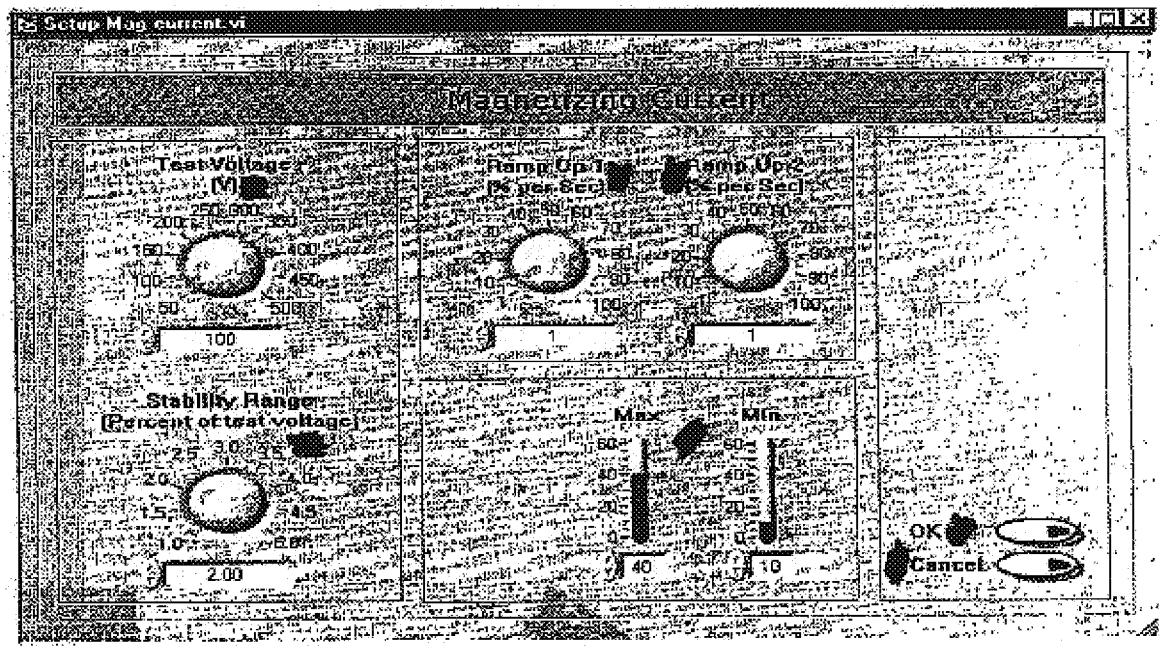
FIG. 8 is an exemplary magnetizing current test setup screen shot in accordance with the present invention.

An exemplary magnetizing current test setup screen shot is shown in FIG. 8. A high voltage is applied on the high side of the transformer in order to demagnetize it. The low side is not short-circuited. The magnetizing current test is to demagnetize the core, by applying a high voltage on the high side of the transformer.

The user can choose the voltage applied on the high side of the transformer by selecting the voltage, e.g., by moving the knob, scrolling the scroll bar, or typing in the required value. 380V is a typical amount that is applied on the high side in this circumstance, but a range is provided. The stability range is a percentage of the test voltage, and is user selectable.

Figure 9:
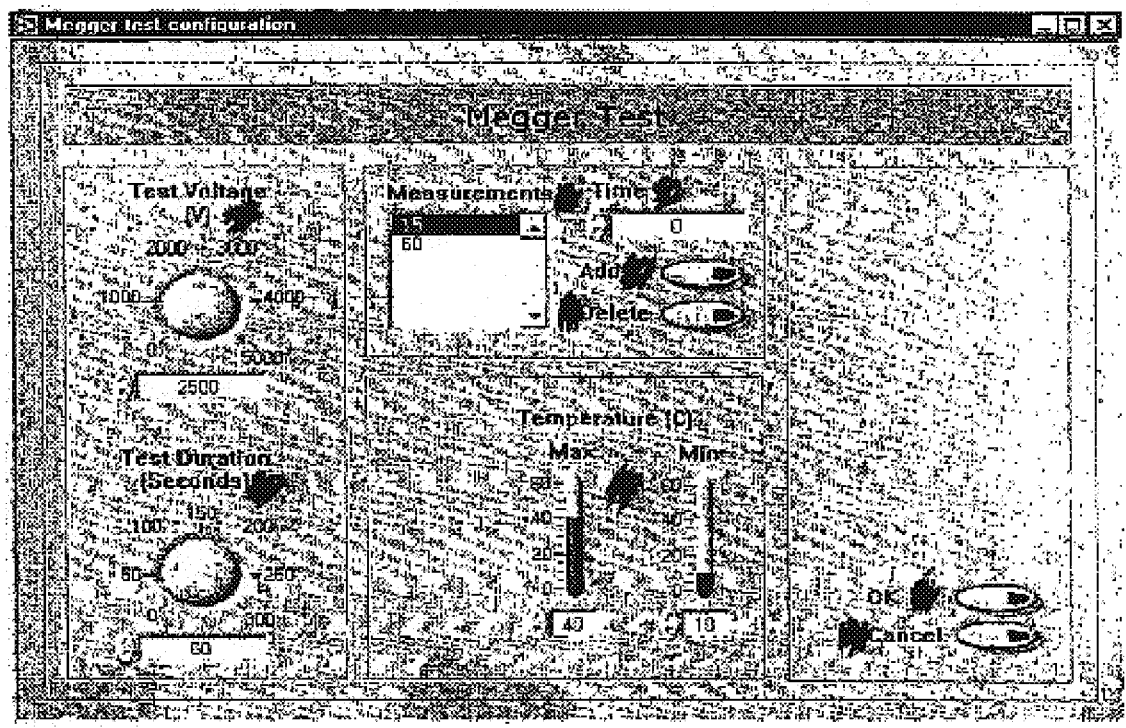
FIG. 9 is an exemplary megger test setup screen shot in accordance with the present invention.

An exemplary megger test setup screen shot is shown in FIG. 9. The megger test is an insulation test with a relatively low applied DC voltage. The user gets the result as a resistance value. Test voltage can be set by the user, and it is the relatively low DC voltage applied between the bushings and the ground. The user can select the desired voltage, e.g., by moving the knob, or scrolling the scroll bar, or typing it in. Regarding test duration, the user preferably has a choice between 0 and about 300 seconds for the length of the test.

Measurements of the resistance can be taken at any point in time that the user desires. The polarization index is the number the user gets by dividing the resistance value at, for example, 60 seconds by the resistance value at, for example, 15 seconds. The user chooses the time values at which the resistance is to be measured and the polarization index, though optional, will be determined in accordance with the user's time entries.

The time at which the resistance will be measured can be set via a scroll bar or other input devices. The user can add as many times as desired. The maximum and minimum temperature under which the test will take place can also be set by the user.

Figure 10:
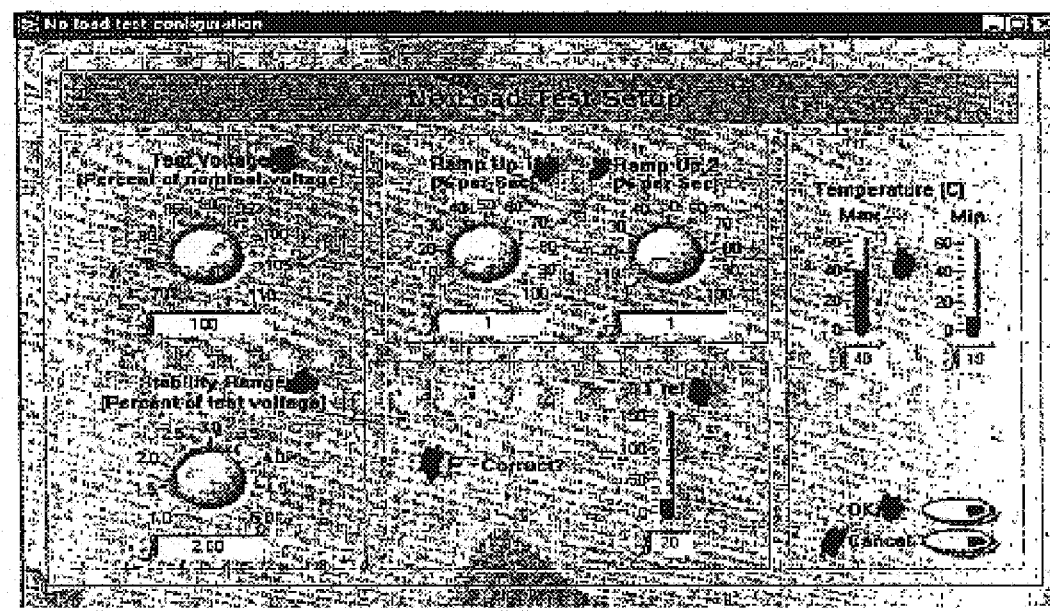
FIG. 10 is an exemplary no load test setup screen shot in accordance with the present invention.

An exemplary no load test setup screen shot is shown in FIG. 10. The no load loss is the power in the magnetic field also called iron loss. Power is applied to the low voltage side so that the magnetic field is under normal operation, and the power is then measured.

The test voltage here is a percent of the nominal voltage. The user can choose the percentage of the nominal voltage desired to be applied. The range for the percentage is between about 70% and about 110%.

The stability range is user selectable and is a percent of the test voltage, which runs from about 1.0 to about 5.0. If the box near "correct" is checked, then the user has the ability to set his own temperature reference. If, on the other hand, this box is not checked, then the T ref. will gray out, and the reference temperature will be set automatically, so the user will not have the ability to set it. T ref is the reference temperature that the user goes by in order to maintain a fixed variable throughout testing. It is the temperature to which the no load loss can be compared.

The maximum and minimum temperatures for the test to run are preferably user selectable. The test will run as long as the temperature through out the testing remains in between the maximum and the minimum temperatures.

Figure 11:
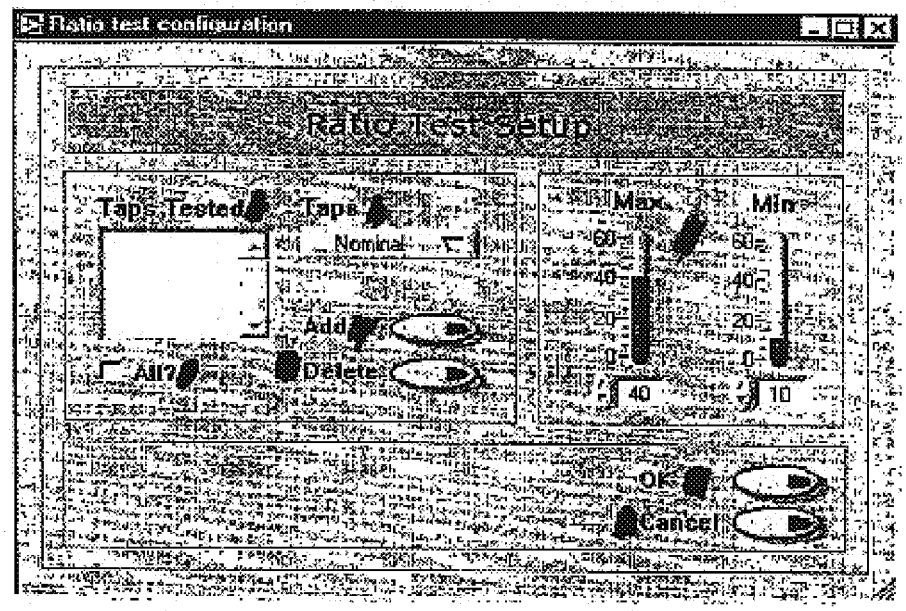
FIG. 11 is an exemplary ratio test setup screen shot in accordance with the present invention.

An exemplary ratio test setup screen shot is shown in FIG. 11. The ratio test tests the ratio to be fixed according to the taps. For example, if tap 1 is set to 5% and the user chooses tap 1, then the ratio increases by 5%. Taps tested shows the taps that have been entered by the user, and these taps will undergo the test.

The delete button deletes any unwanted taps that have already been added. This may be done, for example, by highlighting the unwanted tap, and clicking the delete button. If the "all" box is checked, then all the taps will be selected, and the user will not have access to adding or deleting.

The maximum and minimum temperatures are the limits between which the test temperature lies. If the test temperature exceeds the maximum, or is below the minimum, then the test will not run. The user can set the desired maximum and minimum temperatures.

Figure 12:
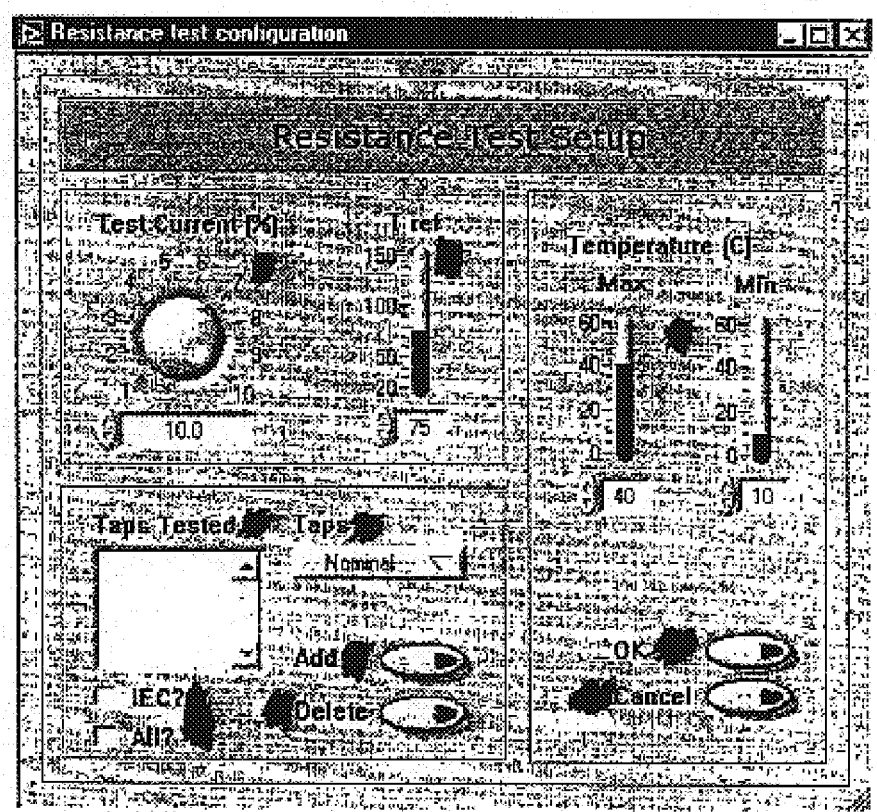
FIG. 12 is an exemplary resistance test setup screen shot in accordance with the present invention.

An exemplary resistance test setup screen shot is shown in FIG. 12. The resistance test measures the three connected windings of the transformer to determine whether they have the same resistance. A percentage of the rated current can be set. The user can choose the test current to be between about 1% and about 10% of the value of the rated current.

T ref, is the reference temperature to which the temperature is compared in order to keep a fixed variable. It is the temperature at which the resistance can be compared. The user can set this temperature as desired.

The taps that will undergo the testing are displayed. IEC standards can be applied to any of the taps. If the user checks the IEC box, then the test is performed in accordance with IEC standards.

Figure 13:
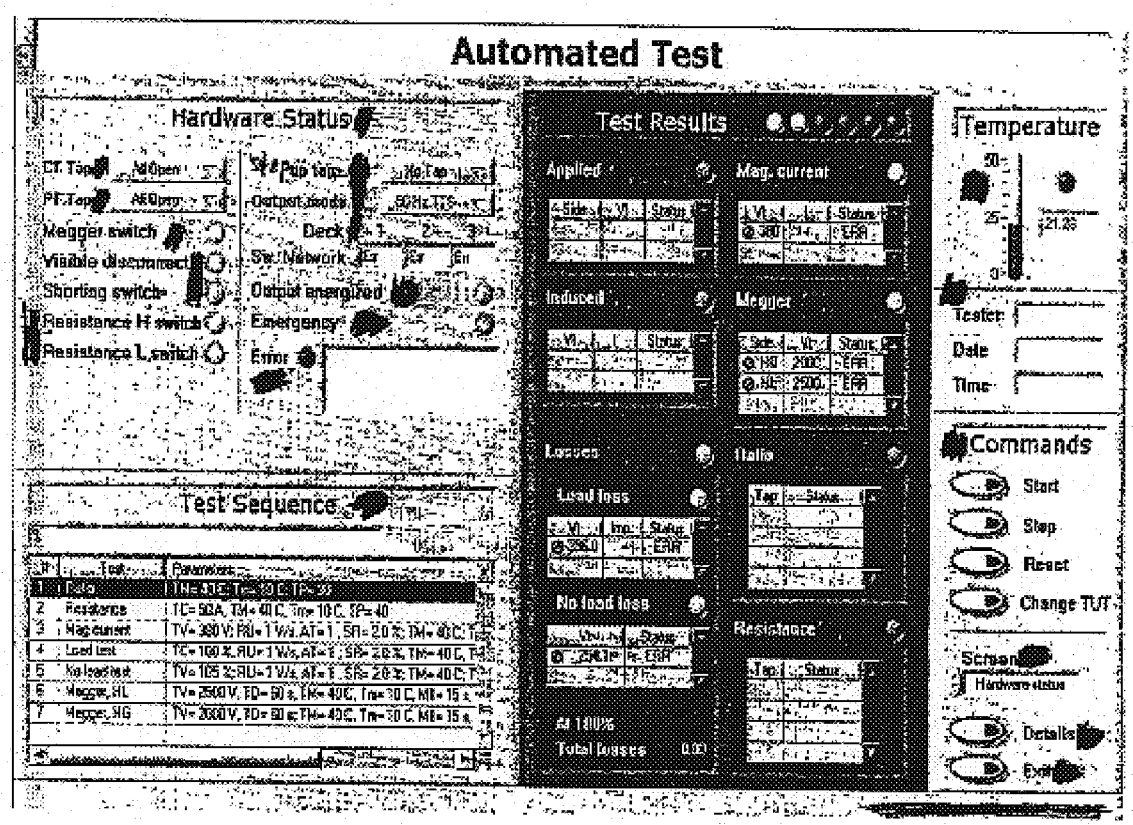
FIG. 13 is an exemplary test engine screen shot in accordance with the present invention.

After creating the transformer test sequence, the user or a tester can open the test sequence using the test sequence engine and run it. The test sequence engine performs the tests in the test sequence and provides an indication of the test results and any system messages, such as error messages and status of the testing. FIG. 13 is an exemplary test engine screen shot in accordance with the present invention.

The engine performs all the tests in the test sequence in the order they are in and with the test parameters in the sequence. The engine communicates with the test equipment such as power supplies and measurement instruments. It also loads the transformer specifications and pass/fail criteria from a database (e.g., memory device 115 in FIG. 1). Preferably, the engine determines a pass/fail criteria for every test and determines a test result for the overall test sequence.

The test sequence engine can also operate on dual and triple voltage transformers. It can accommodate as many as six high and low voltage combinations. The test sequence engine allows the tester to monitor the progress of a test sequence and the results of the tests with a detailed subscreen. It also allows the tester to monitor the hardware status and hardware related errors. The test sequence engine further allows the operator to turn off a certain test. This is useful if the tester decides to skip certain tests in the test sequence, without modifying the test sequence using the test sequence editor.

The test instructions or the pre-existing sequence of test instructions selected are retrieved from a memory device such as the memory device 115 or memory 113 located within the CPU 111. The CPU 111 also retrieves the transformer specifications from the memory device 115. The CPU 111 executes the test program by sequentially executing each of the test instructions in the test program, starting with the first test instruction in the sequence and ending with the last test instruction in the sequence. The sequence of test instructions may be represented by a stream of data or a list of test instructions. While executing the test program, the CPU 111 generates a test result which typically indicates whether or not the transformer passes the test program. Pass/fail is determined on the transformer being tested based on database parameters or standards. The test result is displayed on the display device 114.

If a certain test fails during the test sequence, the test sequence may be aborted, either manually by an operator monitoring the testing or automatically by the system if the testing criteria have been programmed to abort in such a case. The test engine keeps track of units previously tested. Previous test results are accessible from the memory device 120 or wherever the results may be stored.

Preferably, the operator can cancel tests even though they are part of the test sequence. This is desirable in the case in which a transformer is retested and some tests are not required.

Some transformers have up to three high voltage sides and up to two low voltage sides. The test engine desirably deals with these units as six separate units to account for all the combinations. The system preferably keeps track of the pass/fail status of each one of them. A combination can be assigned a test sequence different from the test sequence of the other combinations.

The user may customize the test program by selecting the desired test instructions and/or pre-existing sequence of test instructions and then defining the order of execution of each of the test instructions selected by inputting entry commands into the processor 110 via a user interface. In one embodiment of the present invention, the user may interact with the processor through a Windows 2000 graphical user interface manufactured by Microsoft. However, the present invention may also be implemented using other operating systems such Windows NT and Mac O/S. Thus, with the use of an input/output device such as a keyboard or mouse, the user selects the test instruction or sequence of test instructions desired. The user can also defines the order of execution by placing each selected test instruction in the correct location in the sequence which may be represented by list or a stream of test instructions. Thus, the processor sequentially executes each test instruction starting with the first test instruction in the list or stream and ending with the last test instruction in the list or stream.

By allowing the user to customize test programs via the user interface, the user has the flexibility of optimizing each test program for his particular needs. For example, if a user finds it advantageous to reduce the test time for a transformer, he/she may customize a test program to perform those test instructions or subsequences of test instructions most likely to cause a failure first.

The tests available to the user either control some aspect of the hardware or process data. For example, if a megger test subsequence is specified by the user in the test program, then the processor 10 sends a series of commands to the controller 130 to run a megger test on the transformer. When executing each sequence, each test instruction either causes the hardware to perform some function or process data during the execution of the test.

With respect to the engine shown in FIG. 13, "CT" refers to the current transformer tap, and "PT" refers to the potential tap, both of which are user selectable. The step up tap is the transformer's current position. The output mode is also provided.

In an embodiment, there are three decks in the switching network, and there are five taps. In such an embodiment, in each deck, the switching network is in one of the five positions and the position is shown in the area below the deck number.

The megger switch indicates to the user if it is on, off, or if there is an error. The visual disconnect indicator indicates whether the power supply is activated. If the shorting switch is turned on, the low side of the transformer is shorted.

The resistance H switch is the resistance on the high side of the resistance switch, and indicates whether or not the resistance H switch is deactivated. The resistance L switch is the resistance on the low side of the resistance switch, and indicates whether or not the resistance L switch is deactivated.

An indicator also is provided that indicates whether or not the output of the power supply is energized. Also, an indicator is provided that indicates whether an emergency circuit is activated.

If an error occurs, an indicator is preferably activated, and an explanation is desirably presented in a text box. For example, if the wattmeter is not responding, a lamp will turn red, and in the text box a statement will appear informing the user of the error.

In this example, there are six combinations of the transformer, which has up to three on the high voltage side and up to two on the low voltage side. Each combination runs through the test sequence. According to the sequence, in FIG. 13, the combination will be tested on the ratio test first, then on the resistance test, etc., and finally the megger test. When the test sequence changes, so does the order of the testing of the combination.

The test results are also provided (e.g., on another screen (not shown)). For the applied test, the side of the test, High or Low, is presented. The Vt, which is the test voltage, and the status of the test, whether it passed, failed, or had an error occur, are presented as well. The applied test for each combination presents here the side of the transformer being tested [Side], the test voltage [V test, in kV for example], the current [I, in mA for example] and the status which shows whether the test passed, failed or whether an error occurred.

For the magnetizing current test, the test voltage is stated beneath Vt, the current is presented beneath 'I', and the status indicates to the user whether the test passed, failed, or whether an error occurred.

For the induced test, the test voltage [Vt] is shown, and the current [I] is presented, and the status of the test, whether pass, fail, or error, is displayed in a status box. The induced test summary in this embodiment shows the test voltage [V test], the current [I] and the status, which determines whether the test passed, failed, or had an error occur.

For the megger test, the user will see the test Voltage [Vt], and the corresponding side, whether High to Ground, Low to Ground, or High to Low. The status of each of these will be presented as pass, fail, or error if an error occurred.

During the megger test, the user will see the duration, the side which is whether it is the High and ground connected to the Low [HG], or the High and the Low connected to the ground [HL]. The test voltage [Vt] and the status of either side, whether it passed, failed, or whether an error occurred, are also indicated.

The losses tests are shown individually in FIG. 13, under No load loss and Load loss. When the combination reaches this test it goes through the one represented first in the sequence. In this case, it is the load loss, and while the test is being done the user can see the test voltage [Vt], the transformers impedance [Imp] and the status, which states whether the test failed passed or had an error occur in it. The no load loss test shows the test voltage and the status when the combination is being tested there. The load loss test presents the user with the following information, while the test is being undergone: The reference temperature, the voltage, the three phases of the current, the power corrected, the status of the power, the impedance corrected, and the status for the impedance. The no load test shows the measured power, which the user wants to see in the no load loss test, the corrected power, the status of the power, that shows whether it passed, failed, or had an error. It also presents the user with the current phases 1, 2 and 3, as well as the average of the current phases in percentage, and the status of the current, that shows the test status of passing, failing, or having had an error.

While the ratio test is being performed on the combination, the user can see which tap the test is at, and the corresponding status. The status tells the user if the test has failed, passed, or if an error occurred on each particular tap. The ratio test shows the tap, the three phases of the current, phase 1, phase 2, and phase 3. The phases of the ratios are also presented. The test does not undergo any two of these simultaneously, but rather shifts form one to the other one step at a time. The phase angles are presented to the user as well, and show how much the phases are shifted with respect to each other, so there are three phase angles.

For the resistance test, the user views which tap the test is running through, and the corresponding status. The status tells the user is the test has failed, passed, or if an error occurred on each particular tap.

The temperature at which the test is running is also provided. Recall that the user set the maximum and minimum temperatures of the tests in the sequence. This temperature should lie in between the maximum and minimum temperatures that were set for each particular test individually. If the temperature is higher than the maximum, or lower than the minimum, the test will not take place.

System messages can also be provided that present the user with messages on the status of the tests, presenting the errors and the times at which they occurred. The messages are displayed, for example, telling the user the status of the test, when it is beginning to be tested, if it was completed successfully, or whether an error occurred. The time is desirably presented also so that the user knows what time an error occurred or a test started, what time it ended, or what time an error occurred. The system messages can be provided, e.g., on another screen (not shown).

The user can also select tests in the sequence to disable or enable. If all the tests are switched off then no test will be taken even if it is present in the test sequence. So the user has the ability to turn any test off, even if it is present in the test sequence, and not allow it to run and hence the test will not be taken. If all the tests are turned on, then only the ones present in the test sequence will run.

The invention may be embodied in the form of appropriate computer software, or in the form of appropriate hardware or a combination of appropriate hardware and software without departing from the spirit and scope of the present invention. Further details regarding such hardware and/or software should be apparent to the relevant general public. Accordingly, further descriptions of such hardware and/or software herein are not believed to be necessary.

Although illustrated and described herein with reference to certain specific embodiments, the present invention is nevertheless not intended to be limited to the details shown. Rather, various modifications may be made in the details within the scope and range of equivalents of the claims without departing from the invention.

What is claimed:

1. A system for testing a transformer comprising:
    a processor comprising a transformer test engine adapted to execute a user-changeable transformer test sequence comprising a plurality of user-selected tests and instructions in a user-defined order of execution;
    a controller coupled to the processor to output control commands;
    a switcher coupled between the controller and the transformer to switch power to the controller responsive to the control commands; and
    a metering system coupled between the transformer and the processor to receive measurements from the transformer and provide the measurements to the processor.

2. The system of claim 1, further comprising a memory device coupled to the processor for storing transformer specifications.

3. The system of claim 1, further comprising a memory device for storing the transformer test sequence.

4. The system of claim 1, wherein the processor further comprises a test sequence editor to allow customization of the transformer test sequence.

5. The system of claim 4, further comprising an input device for receiving commands into the test sequence editor.

6. The system of claim 1, wherein the transformer test sequence comprises a plurality of test instructions and associated parameters.

7. A method for testing a transformer comprising:
    connecting the transformer to a processor comprising a transformer test engine;
    loading a user-changeable customized transformer test sequence comprising a plurality of user-selected tests and instructions in a user-defined order of execution into the processor; and
    executing the customized transformer test sequence with the transformer test engine.

8. The method of claim 7, further comprising:
    providing results of the execution to the processor;
    providing transformer specifications to the processor; and
    determining whether the transformer passes responsive to the results and the transformer specifications.

9. The method of claim 8, further comprising activating an indicator responsive to the step of determining.

10. The method of claim 8, further comprising storing the results in a memory device.

11. The method of claim 7, further comprising receiving the customized transformer test sequence prior to loading.

12. The method of claim 7, wherein executing the customized transformer test sequence comprises sequentially executing a plurality of test instructions with associated parameters until one of the end of the sequence is reached and an abort command is received.

13. A method for creating or editing a customized transformer test program comprising:
- receiving a user selection of at least one test instruction or pre-existing sequence of test instructions from a plurality of transformer test instructions;
- providing at least one associated parameter for each of the selected test instructions or pre-existing sequence of test instructions;
- receiving a user-defined order of execution of each of the test instructions; and
- generating a user-changeable transformer test sequence comprising the at least one user-selected test instruction or pre-existing sequence of test instructions in the user-defined order of execution.

14. The method of claim 13, further comprising storing the order of execution of each of the test instructions.

15. The method of claim 13, further comprising executing the test instructions in accordance with the order.

16. The method of claim 13, further comprising receiving an input command, and wherein the step of receiving a user selection is performed in response to the input command.

17. A computer readable medium having computer-executable instructions for performing the steps comprising:
- receiving a user selection of at least one test instruction or pre-existing sequence of test instructions from a plurality of transformer test instructions;
- providing at least one associated parameter for each of the selected test instructions or preexisting sequence of test instructions;
- receiving a user-defined order of execution of each of the test instructions; and
- generating a user-changeable transformer test sequence comprising the at least one user-selected test instruction or pre-existing sequence of test instructions in the user-defined order of execution.

18. The computer readable medium of claim 17, having further computer-executable instructions for storing the order of execution of each of the test instructions.

19. The computer readable medium of 17, having further computer-executable instructions for executing the test instructions in accordance with the order.

20. The computer readable medium of 17, having further computer-executable instructions for receiving an input command, and wherein the step of receiving a user selection is performed in response to the input command.

21. In a computer implemented device having a computer readable storage medium having computer executable components, the computer executable components comprising:
- a data store for storing a user-changeable transformer test sequence comprising a plurality of user-selected transformer tests and instructions to be performed in a user-defined order of execution on a transformer by a transformer test engine; and
- a processor for reading the transformer test sequence and directing the transformer test engine to operate in accordance with the transformer test sequence.

22. The device of claim 21, wherein the data store further stores transformer specifications.

23. The device of claim 21, wherein the processor further receives commands for creating and editing the transformer test sequence.

24. The device of claim 21, wherein the transformer test sequence comprises a plurality of test instructions and associated parameters.

* * * * *